US012685229B2

(12) United States Patent
Chen et al.

(10) Patent No.:    US 12,685,229 B2
(45) Date of Patent:        Jul. 14, 2026

(54) SELECTIVE WIRE COATING DURING WIRE BONDING

(71) Applicant: Sandisk Technologies, Inc., Milpitas, CA (US)

(72) Inventors: Darryl Wong Jun Chen, Kuching (MY); Jiun Dong Loeh, Bayan Lepas (MY); Muhammad Farhan Taufiq Mohamad Helmi, P. Klang (MY)

(73) Assignee: Sandisk Technologies, Inc., Milpitas, CA (US)

( * ) Notice: Subject to any disclaimer, the term of this patent is extended or adjusted under 35 U.S.C. 154(b) by 353 days.

(21) Appl. No.: 18/449,502

(22) Filed: Aug. 14, 2023

(65) Prior Publication Data

US 2024/0429196 A1      Dec. 26, 2024

Related U.S. Application Data

(60) Provisional application No. 63/509,125, filed on Jun. 20, 2023.

(51) Int. Cl.
| | |
|---|---|
| *H10W 90/00* | (2026.01) |
| *H10W 74/01* | (2026.01) |
| *H10W 74/10* | (2026.01) |
| *H10W 72/00* | (2026.01) |
| *H10W 72/50* | (2026.01) |
| *H10W 90/24* | (2026.01) |

(52) U.S. Cl.
CPC ........... *H10W 90/00* (2026.01); *H10W 74/01* (2026.01); *H10W 74/117* (2026.01); *H10W 72/01515* (2026.01); *H10W 72/07131*

(2026.01); *H10W 72/075* (2026.01); *H10W 72/07552* (2026.01); *H10W 72/07553* (2026.01); *H10W 72/527* (2026.01); *H10W 72/537* (2026.01); *H10W 72/5473* (2026.01); *H10W 72/553* (2026.01); *H10W 72/555* (2026.01); *H10W 90/24* (2026.01); *H10W 90/752* (2026.01); *H10W 90/754* (2026.01)

(58) Field of Classification Search
CPC ...................... H01L 24/48; H01L 2225/06562
See application file for complete search history.

(56) References Cited

U.S. PATENT DOCUMENTS

2002/0089069 A1*    7/2002    Lamson ................ H01L 23/642
                                                                    257/784
2022/0189906 A1*    6/2022    Kim ........................ H01L 25/50

* cited by examiner

*Primary Examiner* — Yu-Hsi D Sun
(74) *Attorney, Agent, or Firm* — Michael Best & Friedrich LLP

(57)                    ABSTRACT

A semiconductor device wherein a selected subset of bond wires is coated with an electrically insulating polymer to reduce occurrences of electrical shorts caused by wire sweep in the flow of a molding compound during an encapsulation stage of the manufacturing process. In some examples, the bond wires to be coated are selected based on a set of criteria that flag the bond wires exhibiting a relatively high tendency towards forming such electrical shorts. A specialized wire-bonding tool that can be operated to produce both polymer-coated bond wires and bare bond wires is also provided.

16 Claims, 11 Drawing Sheets

| Gold Wire Diameter | Gold Wire Length |
|---|---|
| 0.6mm | >75 mils (Forward Bonding), >40 mils (Reverse Bonding) |
| 0.7mm | >90 mils (Forward Bonding), >93 mils (Reverse Bonding) |

FIG. 6

SELECTIVE WIRE COATING DURING WIRE BONDING

CROSS-REFERENCE TO RELATED APPLICATION

This application claims priority to and the benefit of U.S. Provisional Patent Application No. 63/509,125, filed on Jun. 20, 2023, the entire contents of which is incorporated herein by reference.

FIELD

This application relates generally to assembly of integrated circuits (ICs), and more particularly but not exclusively, to methods and apparatus for wire bonding.

BACKGROUND

One method directed at reducing the physical size of a multi-die IC package includes stacking constituent dies on top of one another. When the stack of dies is relatively tall, the wires electrically connecting individual dies of the stack to the underlying substrate may be relatively long. For at least some die-stack designs, some of the long wires may be deformed during the molding process. The deformed wires may cause a short circuit among some wires formed on the stack of dies.

SUMMARY

Disclosed herein are various embodiments of a semiconductor device wherein a selected subset of bond wires is coated with an electrically insulating polymer to reduce occurrences of electrical shorts caused by wire sweeps in the flow of a molding compound during an encapsulation stage of the manufacturing process. In some examples, the bond wires to be coated are selected based on a set of criteria that flag the bond wires exhibiting a relatively high tendency towards forming such electrical shorts. A specialized wire-bonding tool that can be operated to produce both polymer-coated bond wires and bare bond wires is also provided.

According to an example embodiment, provided is a semiconductor device comprising: a substrate having a first main surface and an opposing second main surface; one or more semiconductor dies attached to the first main surface; a plurality of bond wires electrically connecting at least one of the one or more semiconductor dies to the first main surface of the substrate, wherein one or more of the plurality of bond wires have been selectively coated with a polymer; and a molding compound encapsulating the one or more semiconductor dies, the plurality of bond wires, and at least a portion of the first main surface of the substrate.

According to another example embodiment, provided is a wire-bonding tool, comprising: a capillary portion including an approximately cylindrical body having a longitudinal center channel configured to deliver a bond wire to a first end of the approximately cylindrical body from an opposite second end thereof and further having a circumferential channel configured to deliver a fluid polymer from an inlet port thereof to the first end of the approximately cylindrical body; and a polymer-dispensing device connected to the inlet port and operable to controllably dispense volumes of the fluid polymer into the inlet port, wherein the circumferential channel includes a cylindrical-sheet channel configured to coat a segment of the bond wire exiting the first end of the approximately cylindrical body with a layer of the fluid polymer.

According to yet another example embodiment, provided is a method for manufacturing a semiconductor device, the method comprising: bonding segments of a bond wire between a vertical stack of semiconductor dies and a first main surface of a substrate, the segments of the bond wire providing electrical connections between the semiconductor dies and the substrate, the vertical stack being supported on the first main surface of the substrate and having the semiconductor dies thereof horizontally offset with respect to one another; coating a selected subset of the segments of the bond wire with an electrically insulating polymer; and encapsulating, with a molding compound, the vertical stack of semiconductor dies, the segments of the bond wire attached between the vertical stack of semiconductor dies and the first main surface of the substrate, and at least a portion of the first main surface of the substrate.

In some embodiments, the above method further comprises selecting a subset of the segments of the bond wire for polymer coating based on one or more selection criteria from the group consisting of: a set of criteria specifying a relationship between a segment length, a wire diameter, and a direction of the bonding; an orientation angle of a corresponding bond wire in the semiconductor device with respect to a flow direction of the molding compound during the encapsulating; an arch height of the corresponding bond wire in the semiconductor device with respect to the first main surface of the substrate; and a bond-wire pitch in a corresponding part of the semiconductor device.

BRIEF DESCRIPTION OF THE DRAWINGS

FIG. 6 is a table illustrating a set of wire-selection criteria according to one example.

DETAILED DESCRIPTION

In a typical IC-fabrication process, dies (chips) are produced in relatively large batches using wafers of silicon or other suitable material(s). Electrical and optical circuits can be gradually created on a wafer using a multi-step sequence of photolithographic and chemical processing steps. Such a wafer may then be cut ("diced") into many pieces (chips, dies), with at least some of the individual chips containing a respective copy of the circuit that is being fabricated. An individual functional die can be appropriately packaged prior to being incorporated into a larger circuit or be left non-packaged.

As used herein, the term "stack" refers to an orderly arrangement of packaged or non-packaged dies in which main planes of the stacked dies face and are near each other.

The facing dies or chips may be electrically connected, e.g., using patterned conducting (such as metal) layers, ball-grid arrays, solder bumps, bond wires, etc. In some embodiments, the dies or chips of a stack can be mounted on a mechanical carrier in an orientation in which the main planes of the stacked dies are parallel to each other and/or to the main plane of the mechanical carrier. In some such embodiments, one of the dies or chips of the stack may function as the mechanical carrier. In some embodiments, individual ICs of the stack and or the carrier may include any combination of one or more respective substrates, one or more redistribution layers (RDLs), one or more interposers, one or more laminate plates, etc.

Herein, a "main plane" of an object, such as a die, a substrate, or an IC, is a plane parallel to a substantially planar surface thereof that has about the largest area among exterior surfaces of the object. This substantially planar surface may be referred to as a main surface. The exterior surfaces of the object that have one relatively large size, e.g., length, but are of much smaller area, e.g., less than one half of the main-surface area, are typically referred to as the edges of the object.

Herein, the term "vertical" refers to a direction that is approximately orthogonal to a main plane of a die or of the corresponding substrate or carrier. The term "horizontal" refers to a direction that is approximately parallel to a main plane of a die or of the corresponding substrate or carrier.

Figure 1:
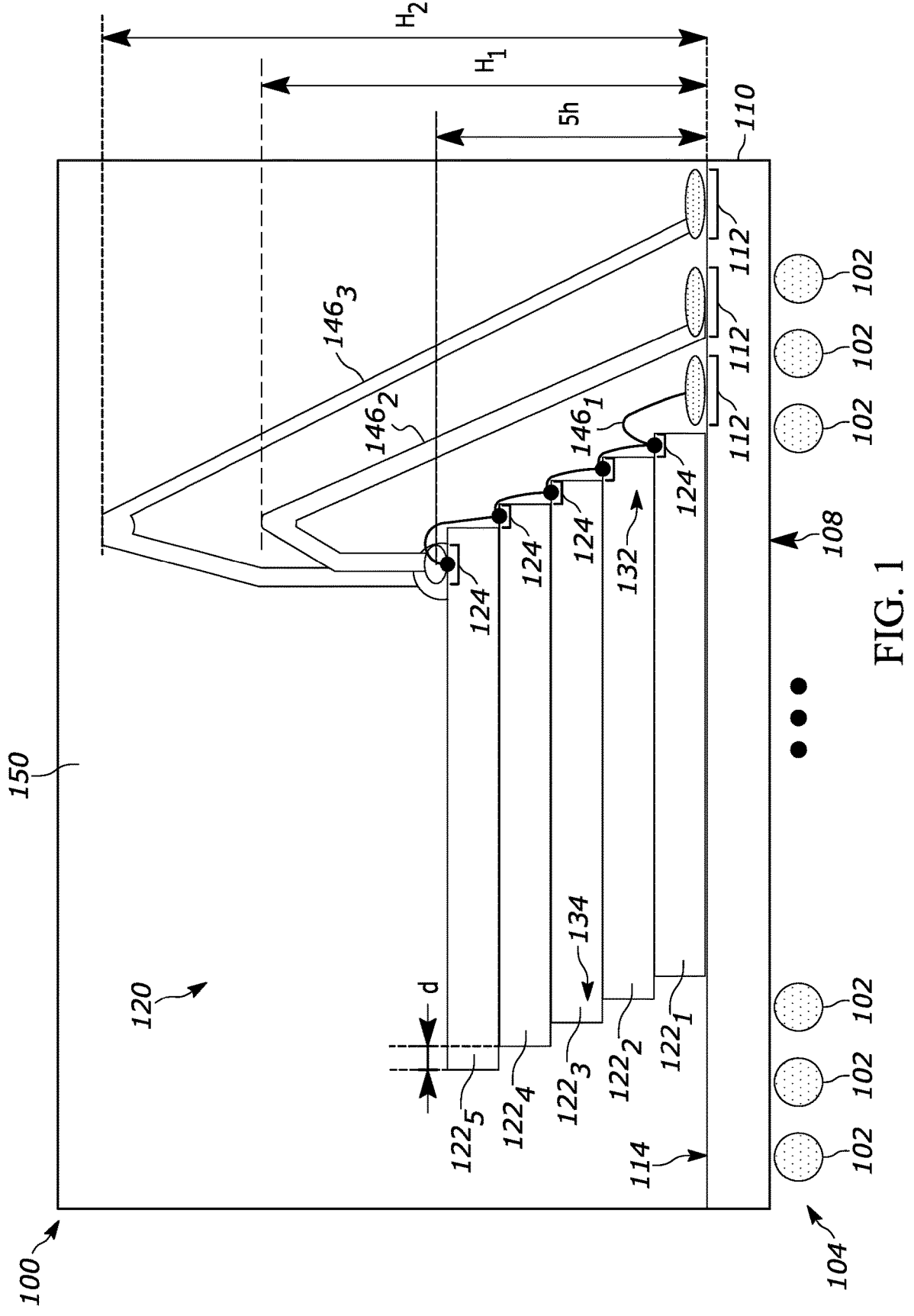
FIG. 1 is a schematic side view illustrating a semiconductor device according to an example embodiment.

FIG. 1 is a schematic side view illustrating a semiconductor device 100 according to an example embodiment. The device 100 comprises a substrate 110 and a die stack 120 electrically connected and attached to a first (illustratively upper) main surface 114 of the substrate 110. An opposing second (illustratively lower) main surface 108 of the substrate 110 has a plurality of solder balls 102 attached thereto, e.g., in a grid pattern, thereby providing a ball-grid array (BGA) 104. In an example embodiment, the substrate 110 has a plurality of conducting paths therein. Some of such conducting paths are configured to electrically connect the first and second main surfaces 108, 114 in accordance with an intended pattern and/or layout. These electrical connections are used, inter alia, to properly electrically connect the die stack 120 to different solder balls 102 of the BGA 104.

The die stack 120 is illustratively shown as having five individual semiconductor dies $122_k$, which are labeled in FIG. 1 using the reference numerals $122_1$-$122_5$. In an alternative embodiment, the die stack 120 may have a different (from five) number of semiconductor dies $122_k$. In some embodiments, the semiconductor dies $122_1$-$122_5$ may be nominally identical, within the fabrication-process variances. In one possible embodiment, a semiconductor die $122_k$ may, for example, be a non-volatile memory (NVM) die, such a NAND flash memory die or other suitable type of memory die.

In the example shown, the semiconductor dies $122_1$-$122_5$ are stacked atop each other in an offset, stepped configuration, as illustrated in FIG. 1. Different adjacent dies $122_1$ may be fixedly attached to each other, e.g., using a die attach film (DAF) or another suitable attachment material. In some embodiments, the DAF may be cured after its application to create a relatively strong (e.g., permanent) bond between the adjacent dies $122_k$. The semiconductor die $122_1$ may be similarly attached to the surface 114 of the substrate 110. The offset, stepped configuration of the semiconductor dies $122_1$-$122_{16}$ causes the die stack 120 to have two opposing sloped, stepped surfaces, i.e., a first stepped surface 132 and a second stepped surface 134. Each individual step of the stepped surfaces 132, 134 has a vertical dimension (height)

that is approximately equal to the thickness of the corresponding die $122_k$ and a horizontal dimension or depth d that represents the length of the corresponding horizontal inter-die offset. In an example embodiment, all steps of the stepped surfaces 132, 134 may have approximately the same height h and depth d. In an alternative embodiment, some steps of the stepped surfaces 132, 134 may have different respective heights and/or depths.

Each semiconductor die $122_k$ includes a respective plurality of small, densely packed contact pads 124 aligned along a leading edge of the die (illustratively, the right edge, in FIG. 1). In the view shown in FIG. 1, only one contact pad 124 per semiconductor die 122 is visible. Only some of such contact pads have numerical labels 124 explicitly shown in FIG. 1 due to the space constraints and for ease of understanding. A person of ordinary skill in the pertinent art will readily understand that the number, size, and spacing of contact pads 124 on a semiconductor die $122_k$ may vary in different embodiments.

The substrate 110 similarly includes a corresponding plurality of contact pads 112 on the main surface 114 thereof. In the view shown in FIG. 1, only three contact pads 112 of the plurality of such contact pads is visible. The spacing (in the direction orthogonal to the plane of the drawing of FIG. 1) between the adjacent contact pads 112 may be the same as or different from the spacing between the adjacent contact pads 124. A respective bond wire $146_i$ is connected between each contact pad 112 and the corresponding set of contact pads 124 on the semiconductor dies $122_1$-$122_5$, e.g., as indicated in FIG. 1, thereby creating an electrical connection therebetween. For example, the bond wire $146_1$ serially connects the corresponding contact pads 124 of different ones of the semiconductor dies $122_1$-$122_5$ to the corresponding one of the contact pads 112. The bond wire $146_2$ is connected between another one of the contact pads 112 and the corresponding contact pad 124 of the semiconductor die $122_5$. The bond wire $146_3$ is similarly connected between yet another one of the contact pads 112 and another corresponding contact pad 124 of the semiconductor die $122_5$. Note that the bond wire $146_1$ has five relatively short arch-shaped segments, each of which has fixedly attached ends. Each of the bond wires $146_2$, $146_3$ is also arch shaped but has a significantly larger unsupported length between the fixed ends thereof. The heights of the arches of the bond wires $146_2$, $146_3$ are $H_1$ and $H_2$, respectively, where $H_1 < H_2$. In some examples, additional relatively long bond wires $146_i$ having a single-arch shape may be connected between the corresponding contact pads 112 on the surface 114 of the substrate 110 and the corresponding contact pads 124 on different ones of the semiconductor dies $122_1$-$122_5$. Collectively, the different bond wires $146_i$ may form one or more buses that can be used, e.g., to implement an input/output (I/O) interface for the die stack 120. In different embodiments, this bus can be an 8-bit bus, a 16-bit bus, or a bus of another suitable bit size.

The die stack 120, the surface 114 of substrate 110, the contact pads 112 and 124, and the bond wires $146_i$ are encapsulated in a molding-compound mass 150 as indicated in FIG. 1. The molding-compound mass 150 may include, for example, solid epoxy resin, phenol resin, fused silica, crystalline silica, carbon black, and/or metal hydroxide. Other suitable molding compounds may similarly be used in other embodiments. The molding-compound mass 150 may be applied using various known techniques, such as transfer molding or injection molding.

During injection molding, the fluid molding compound (which is later cured to form the solid molding-compound mass 150) may be injected through an injection port located at the top or at one of the sides of the die stack 120. The fluid molding compound flows from the injection port along the various surfaces of the die stack 120 and substrate 110 to fill the voids in the mold form. In some cases, this flow may cause a significant uncompensated net force to be applied to the bond wires 146$_i$ for at least some time. This force may disadvantageously cause some of the longer arched wires, such as the bond wires 146$_2$ and 146$_3$, to be deformed from their intended shapes and uncontrollably adapt various unintended shapes that cause some of the bond wires 146$_i$ to touch each other. In the absence of adequate electrical insulation in the areas of such inter-wire contacts, such wire touching may create permanent unwanted short circuits in the semiconductor device 100 after the fluid molding compound is cured.

Various embodiments disclosed herein are directed at preventing the unwanted short circuits from being formed in the semiconductor device 100 during the injection molding operation described above. For example, one embodiment provides a wire-bonding tool that can be operated to selectively coat some of the bond wires 146$_i$ with a suitable electrically insulating polymer. When a coated bond wire 146$_i$ comes into physical contact with another (coated or uncoated) bond wire 146$_j$, the polymer layer on the coated bond wire 146$_i$ prevents an electrical connection from being formed in the area of contact between those two bond wires 146$_j$, thereby beneficially preventing any unwanted short circuits in the end-product semiconductor device 100.

Figure 2:
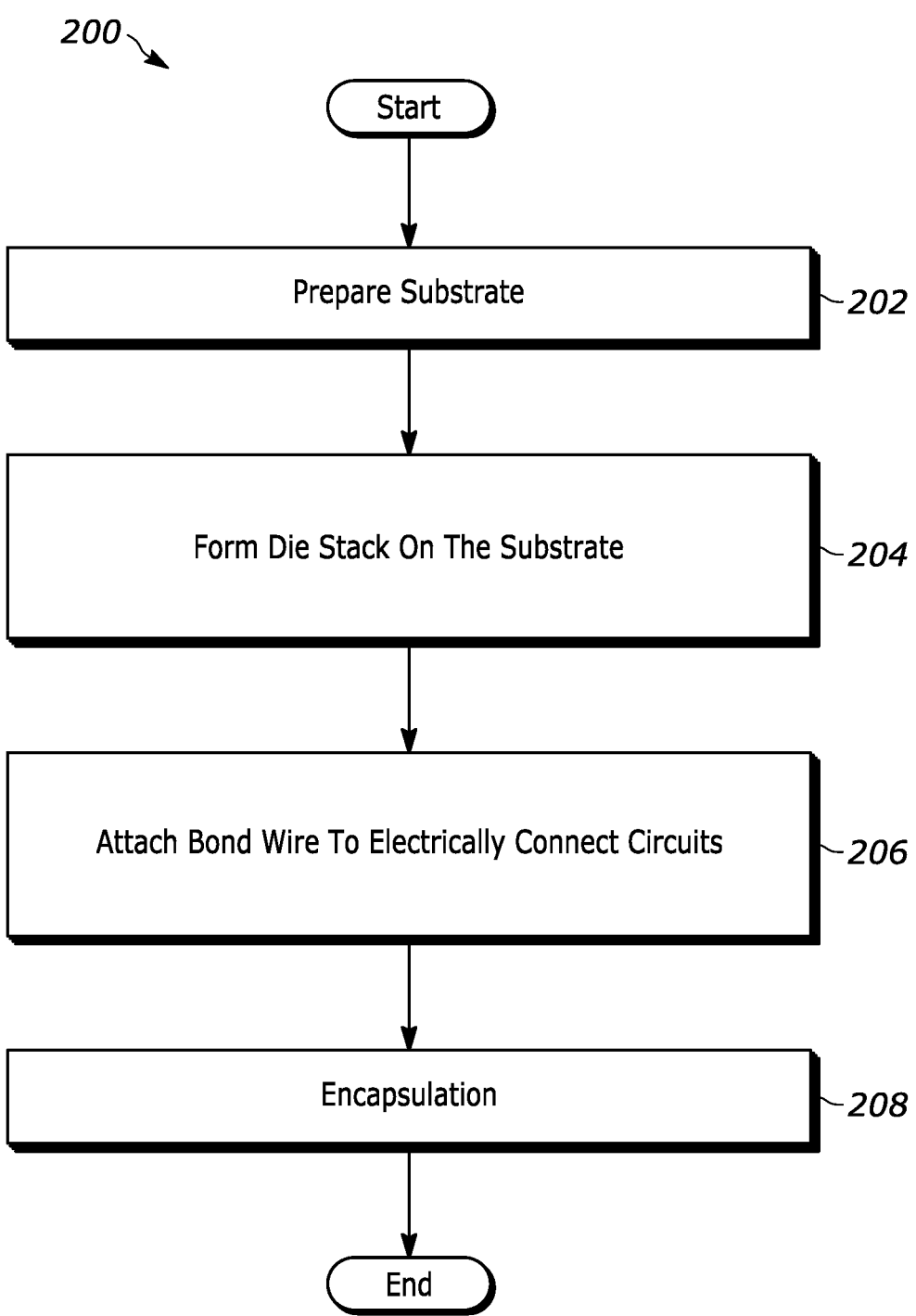
FIG. 2 is a flowchart illustrating a manufacturing method according to various embodiments.

FIG. 2 is a flowchart illustrating a manufacturing method 200 according to various embodiments. At least some embodiments of the method 200 can be used to make the semiconductor device 100 (FIG. 1). A more detailed description of certain specific operations of the method 200 is provided below in reference to FIGS. 3-6.

The method 200 includes preparing the substrate 110 (in block 202). In an example embodiment, the substrate-preparation operations of the block 202 include: (i) forming various electrical paths in and on the substrate 110, e.g., by etching appropriate patterns in various metal layers thereof and connecting the patterned metal layers using metal vias, (ii) laminating two or more of the substrate layers, (iii) forming various pads on the main surface 114, including contact pads 112, and (iv) forming solder-ball pads on the main surface 108.

The method 200 also includes forming the die stack 120 on the substrate 110 (in block 204). For example, the die stack 120 may be formed on the substrate 110 by sequentially attaching individual dies 122$_k$. More specifically, first, the semiconductor die 122$_1$ may be attached to the main surface 114 of the substrate 110 in a designated area. Subsequently, other ones of the semiconductor dies 122$_k$ may be attached, one by one, with each next semiconductor die 122$_k$ being attached in an offset position to the top of the previously attached die 122$_{k-1}$. In some examples, operations of the block 204 of the method 200 also include one or more instances of curing the DAF layers used to attach the semiconductor dies 122$_k$.

The method 200 further includes attaching the bond wires 146$_i$ to electrically connect individual dies 122$_k$ of the die stack 120 to each other and to the substrate 110 (in block 206). In an example embodiment, the bond wires 146$_i$ may be welded to the corresponding contact pads 112, 124 using an automated wire-bonding tool 300, an example embodiment of which is described in more detail below in reference to FIGS. 3A and 3B. An example method of operating the automated wire-bonding tool 300 is described in more detail below in reference to FIGS. 4A-4D.

The method 200 further includes encapsulating the die stack 120, the bond wires 146$_i$, and at least a portion of the main surface 114 of the substrate 110 in a fluid molding compound (in block 208). During the encapsulation, some of the bond wires 146$_i$ may come into physical contact with one another by being swept and/or deformed by the flow of the fluid molding compound, e.g., as explained above. Operations of the block 208 of the method 200 also include curing the fluid molding compound, thereby forming the solid molding-compound mass 150.

In some embodiments, the method 200 may optionally include attaching the solder balls 102 to the corresponding solder-ball pads on the main surface 108 of the substrate 110. In various embodiments, the method 200 may be followed by one or more of package marking, package singulation, and final product testing. The above-described sequence of different operations is for illustration purposes, and various embodiments are not limited to this particular sequence.

Figure 3A:
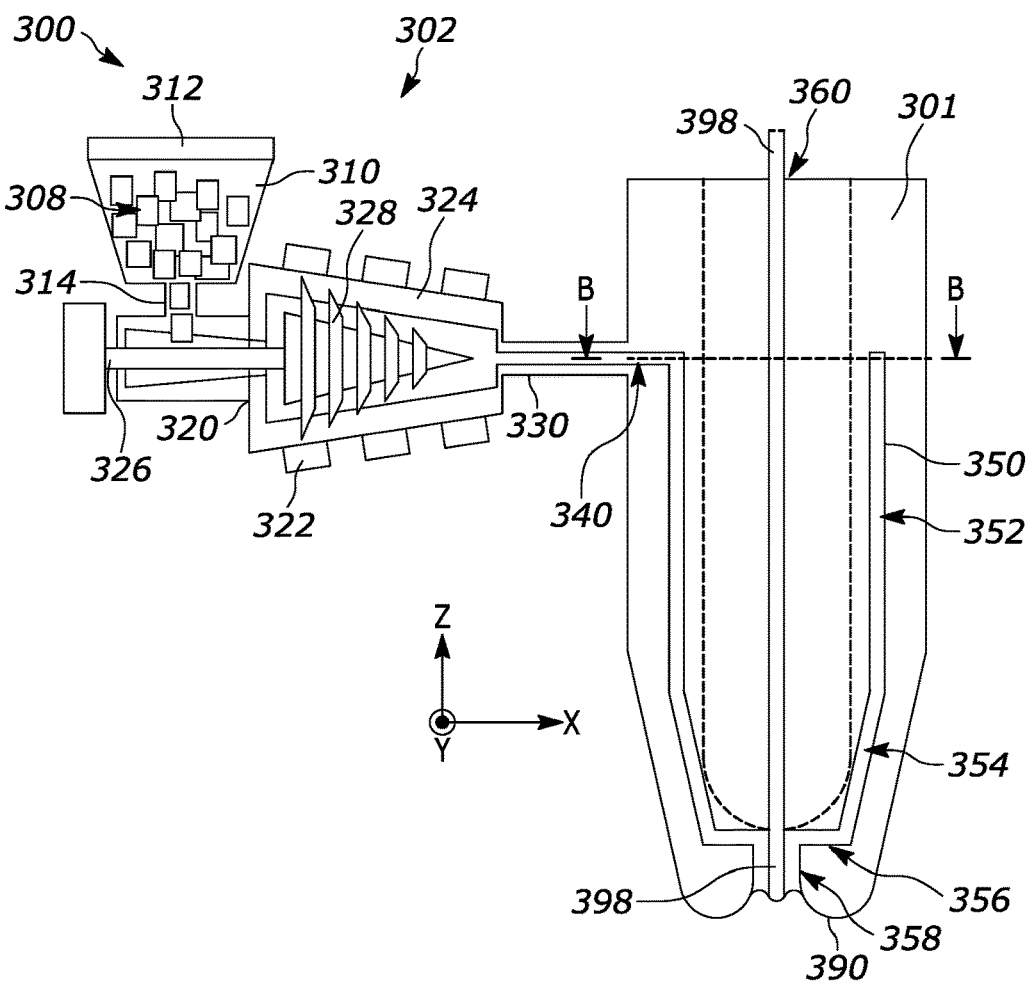
FIGS. 3A and 3B are schematic diagrams illustrating a wire-bonding tool that can be used in the manufacturing method of FIG. 2 according to some embodiments.
Figure 3B:
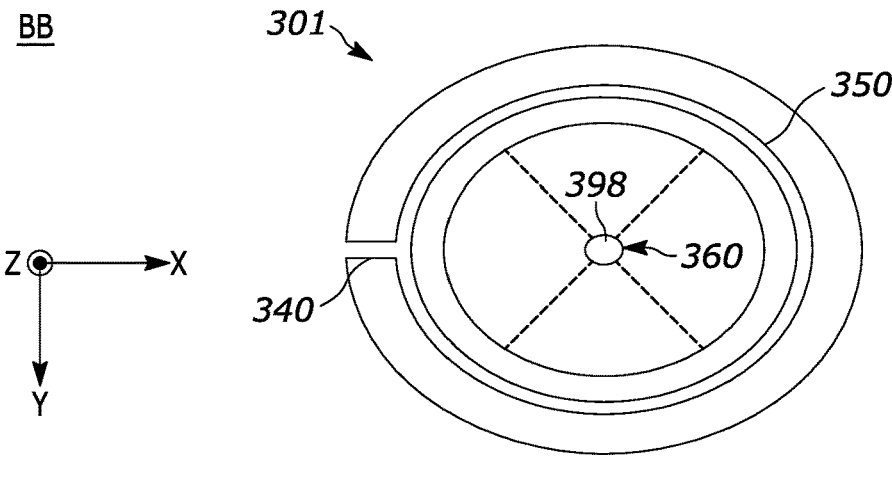

FIGS. 3A and 3B are schematic diagrams illustrating a wire-bonding tool 300 that can be used in the method 200 according to some embodiments. More specifically, FIG. 3A shows a cross-sectional side view of the tool 300. FIG. 3B shows a cross-sectional top view of a capillary portion 301 of the tool 300 along a cross-section plane BB indicated in FIG. 3A. The XYZ-coordinate triad shown in each of FIGS. 3A and 3B indicates the relative orientations of the presented cross-sectional views.

Referring to FIG. 3A, the tool 300 includes the capillary portion 301 and a polymer-dispensing device 302 in fluid communication therewith. The polymer-dispensing device 302 includes a hopper 310 and a heated syringe 320 connected via a tube 314. The hopper 310 has a removable lid 312. The lid 312 is removed from the hopper 310 to enable a granulated (e.g., powdered) solid polymer 308 to be loaded into the confined inner space of the hopper 310 and then is secured back on top of the hopper 310 after the loading. The tube 314 has a sufficiently large inner diameter for the solid polymer 308 to pass therethrough from the hopper 310 into the heated syringe 320.

The heated syringe 320 includes a resistive heating coil 322 disposed along an exterior surface of the syringe's barrel 324. In operation, the resistive heating coil 322 is used to heat up the syringe 320, by passing an electrical current therethrough, to a temperature sufficient to melt or fluidify the solid polymer 308 therein. A plunger 326 and a conical auger 328 of the heated syringe 320 are then operated to controllably move desired volumes of the melted polymer 308 through a transfer hub 330 of the heated syringe 320 and into an inlet port 340 of the capillary portion 301. The rate of motion of the conical auger 328 determines the extrusion rate of the polymer 308 through the capillary portion 301. For example, when the conical auger 328 does not move, substantially no polymer is being extruded through the capillary portion 301.

Referring both to FIGS. 3A and 3B, the capillary portion 301 is approximately cylindrical in shape and has the inlet port 340, a circumferential channel 350, and a center channel 360 in a body thereof. The inlet port 340 is connected to the circumferential channel 350 as indicated in FIGS. 3A and 3B. The center channel 360 is used to feed a metal wire 398 through the capillary portion 301 to a tip 390 thereof. The circumferential channel 350 and the center channel 360 geometrically converge at the tip 390 such that segments of the metal wire 398 moving through the center channel 360 can be selectively coated by the polymer 308 extruded through the circumferential channel 350.

In the example shown, the circumferential channel 350 comprises (i) a first cylindrical-sheet channel 352 directly connected to receive the polymer 308 from the inlet port 340 and (ii) a second cylindrical-sheet channel 358 located at the tip 390 of the capillary portion 301 and configured to extrude the polymer 308 onto an exterior surface of segments of the metal wire 398 moving out of the center channel 360. The circumferential channel 350 further comprises a conical-sheet channel 354 and a flat-sheet channel 356 configured to connect the first and second cylindrical-sheet channels 352, 358 to one another for continuous flow of the polymer 308 therethrough. The diameter of the first cylindrical-sheet channel 352 is larger than the diameter of the second cylindrical-sheet channel 358. The transverse size (e.g., thickness) of the first cylindrical-sheet channel 352 is typically significantly smaller than the diameter thereof. The second cylindrical-sheet channel 358 and the center channel 360 are concentric at the tip 390, and the diameter of the second cylindrical-sheet channel 358 is only slightly (e.g., by 10% to 50%) larger than the diameter of the center channel 360. In different embodiments, the transverse sizes of the sheet channels 352, 354, 356, and 358 may be the same or different.

Movement of the metal wire 398 through the center channel 360 and movement of the polymer 308 through the circumferential channel 350 are independently controllable. For example, when both the metal wire 398 and the polymer 308 are moving through the tip 390, the corresponding segments of the metal wire 398 are coated with the polymer 308. On the other hand, when the metal wire 398 is moving through the tip 390 but the polymer 308 is not, the corresponding segments of the metal wire 398 remain bare, i.e., not coated with the polymer 308. As explained above, movement of the polymer 308 through the tip 390 is controlled by actuation of the plunger 326 and the conical auger 328. For example, the polymer 308 is extruded through the tip 390 when the auger 328 is moving. Substantially no polymer is extruded through the tip 390 when the auger 328 is stopped.

In some examples, the metal wire 398 comprises gold. In other examples, other suitable metals or metal alloys can also be used to implement the metal wire 398. In some examples, the polymer 308 comprises a polyimide. In other examples, other suitable electrically insulating polymers can similarly be used to implement the polymer 308. In some examples, the polymer 308 is a thermosetting polymer or plastic. As known in the pertinent art, thermosetting polymers are materials which will remain in a solid state after being cured one time. The thermosetting effect therein is caused by cross-linking between different strands of the polymer during the curing process, which causes permanent chemical bonds to be formed therebetween.

FIGS. 4A-4E are schematic diagrams pictorially illustrating some wire-attach operations of the block 206 of the method 200 according to some examples. The illustrated wire-attach operations employ the wire-bonding tool 300 as explained in more detail below. A person of ordinary skill in the pertinent art will understand that the block 206 of the method 200 may include additional wire-attach operations not explicitly shown in FIGS. 4A-4E. In some examples, at least some of such additional wire-attach operations can be performed using a different (e.g., conventional) wire-attach tool.

Figure 4A:
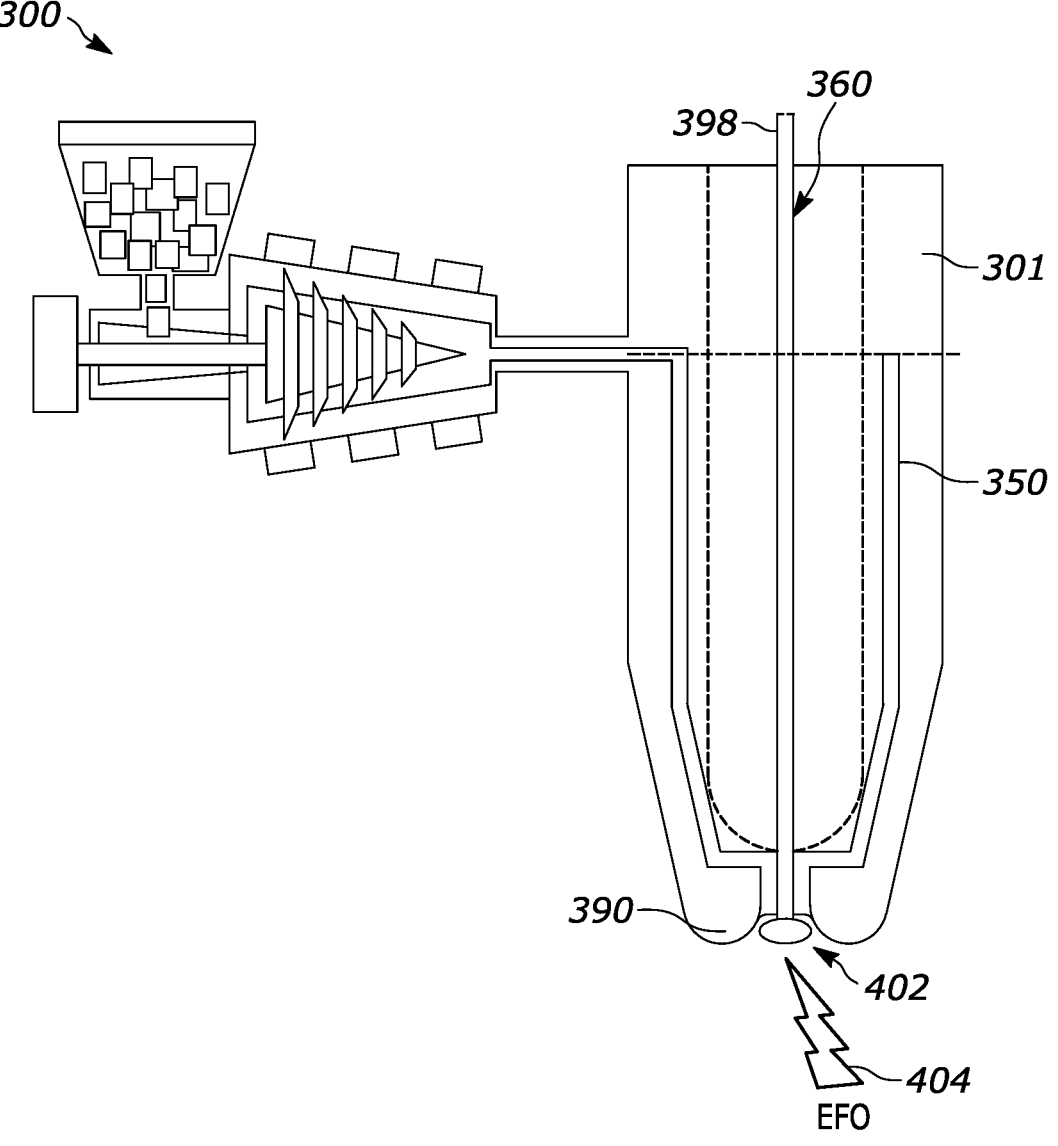
FIGS. 4A-4E are schematic diagrams pictorially illustrating certain wire-attach operations of the manufacturing method of FIG. 2 according to some examples.

FIG. 4A illustrates operations of the block 206 directed at forming of a hanging metal ball 402 at the lower end of the metal wire 298 located at the tip 390 of the capillary portion 301 of the tool 300 according to one example. In the example shown, an electronic flame-off (EFO) 404 is used to heat up an end segment of the metal wire 298 protruding out of the center channel 360. The heat generated via the EFO 404 causes the end segment of the metal wire 298 to melt. The surface-tension forces then cause the molten metal to adapt an approximately spherical shape, thereby forming the hanging metal ball 402.

Figure 4B:
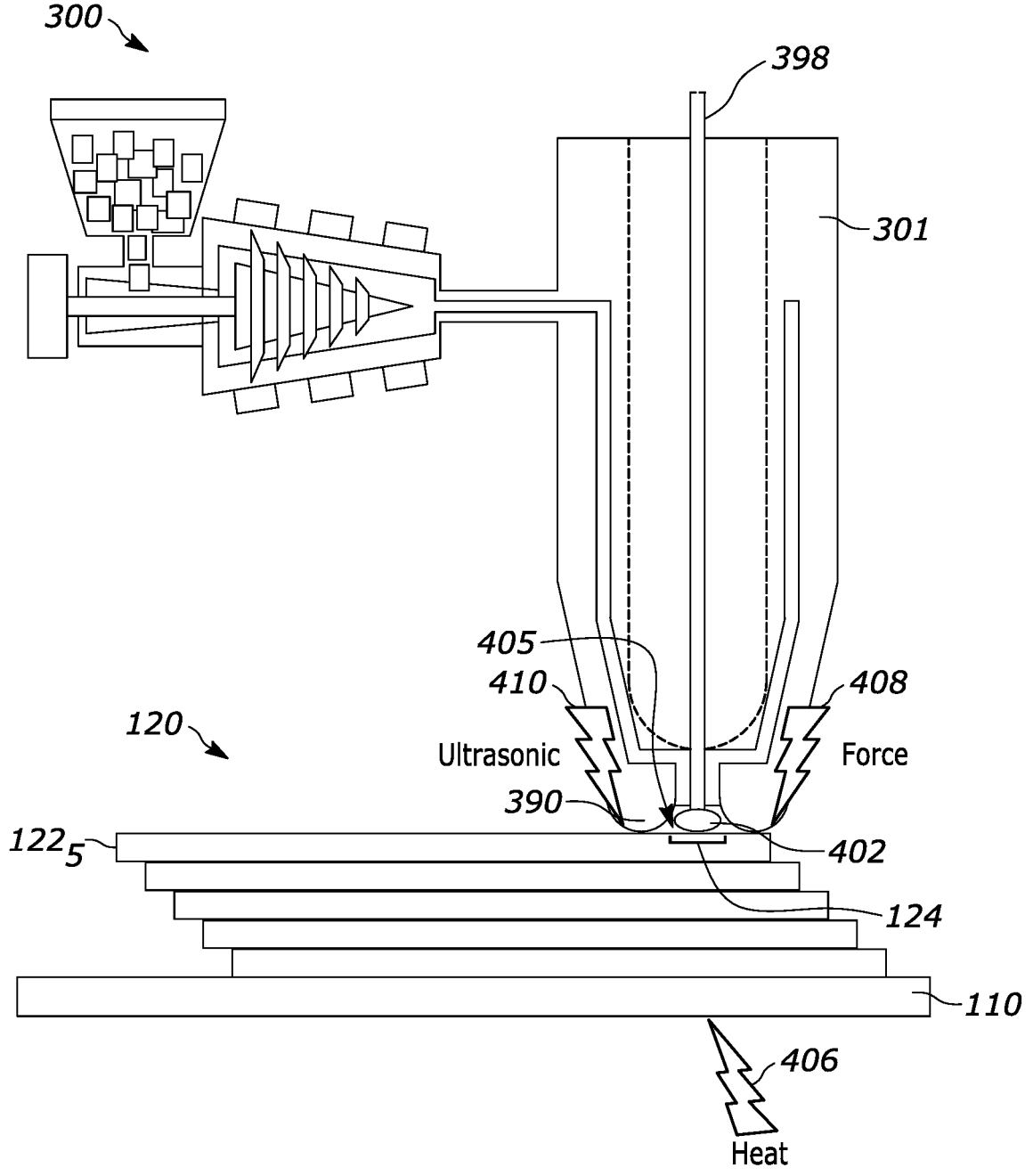

FIG. 4B illustrates operations of the block 206 directed at forming a first wire bond 405 for the nascent bond wire 146$_2$ (shown in FIG. 1) according to one example. To form the first wire bond 405, the tip 390 of the capillary portion 301 is moved to the shown contact pad 124 located on the semiconductor die 122$_5$ of the die stack 120. The hanging metal ball 402 is then brought into physical contact with the contact pad 124 as indicated in FIG. 4B. An adequate amount of heat 406 applied from the bottom of the substrate 110, a static vertical mechanical force 408 applied to the capillary portion 301, and ultrasonic excitation forces 410 applied at the tip 390 of the capillary portion 301, each for a respective amount of time, cause the hanging metal ball 402 to form a strong permanent bond between the adjacent segment of the metal wire 398 and the contact pad 124.

Figure 4C:
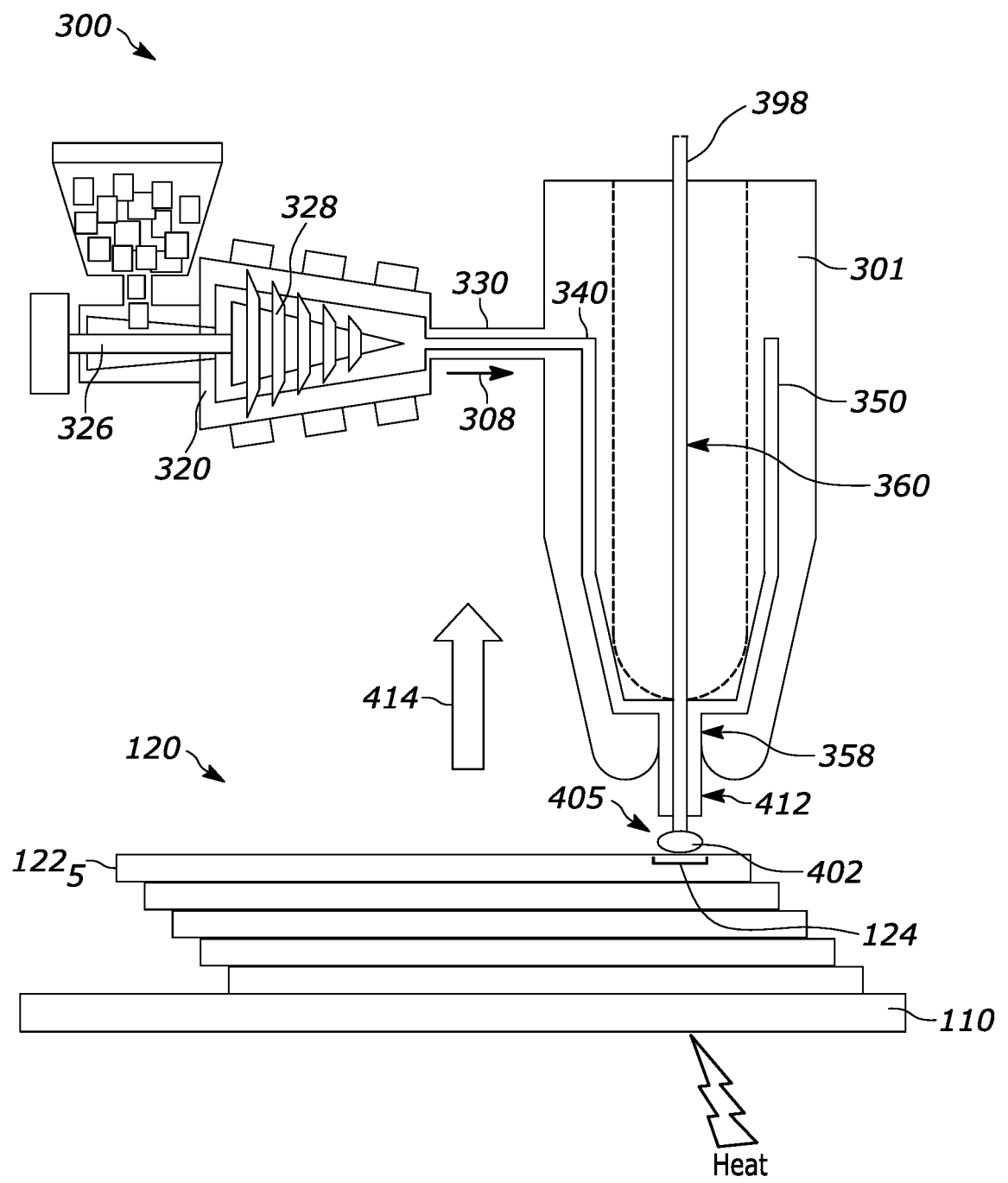

FIG. 4C illustrates operations of the block 206 directed at forming a polymer coat 412 according to one example. The polymer coat 412 is formed by extruding the polymer 308 over the exterior surface of a proximal segment of the metal wire 398 that is being pulled through the central channel 360 out of the tip 390 of the capillary portion 301. The capillary portion 301 slowly travels upward as indicated by a block arrow 414. At the same time, the plunger 326 and the conical auger 328 are operated to push the polymer 308 through the transfer hub 330 of the heated syringe 320 and into the inlet port 340 of the capillary portion 301. The polymer 308 then flows through the circumferential channel 350 and exits therefrom through the second cylindrical-sheet channel 358 to form the polymer coat 412 on the proximal segment of the metal wire 398.

Figure 4D:
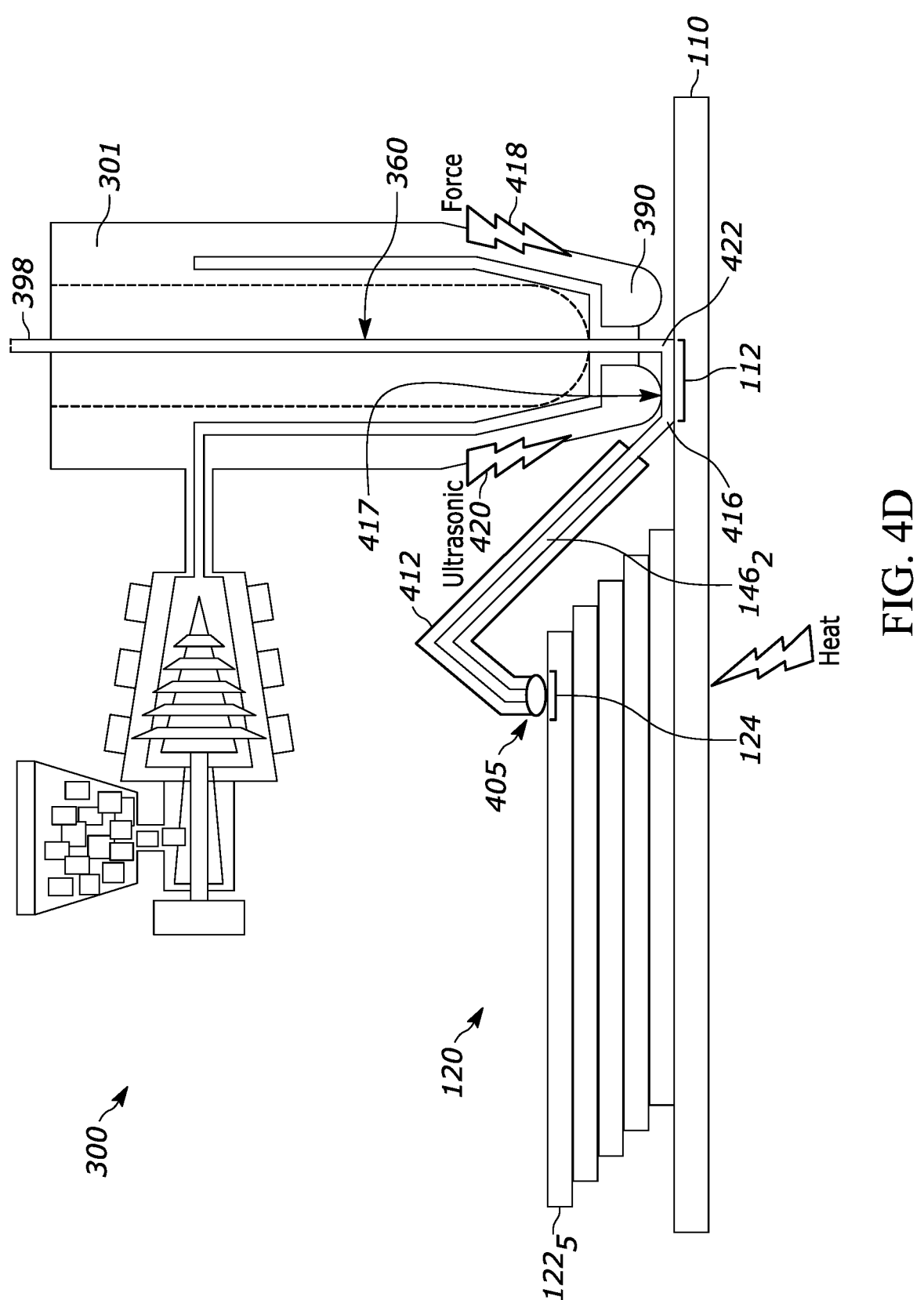

FIG. 4D illustrates operations of the block 206 directed at forming a second wire bond 417 for the bond wire 146$_2$ according to one example. First, the capillary portion 301 travels, form the position indicated in FIG. 4C, along an arched trajectory towards the shown contact pad 112 located on the substrate 110 while the polymer 308 is being continuously extruded from the second cylindrical-sheet channel 358 by the above-described operation of the plunger 326 and the conical auger 328. The arched trajectory causes the segment of the wire exiting the tip 390 to adopt a corresponding arched shape, and the extruded polymer 308 forms the polymer coat 412 along a length of that wire segment as indicated in FIG. 4D. Extrusion of the polymer 308 is stopped, e.g., as described above, just before the metal wire 398 is brought into physical contact with the contact pad 112 to cause the latter to be in physical contact with a bare segment 416 of the metal wire 398. A static vertical mechanical force 418 and ultrasonic excitation forces 420 are then applied at the tip 390 of the capillary portion 301 to permanently bond the bare segment 416 of the metal wire 398 to the contact pad 112. This type of bond is also sometimes referred to in the pertinent literature as the "wedge" bond.

Figure 4E:
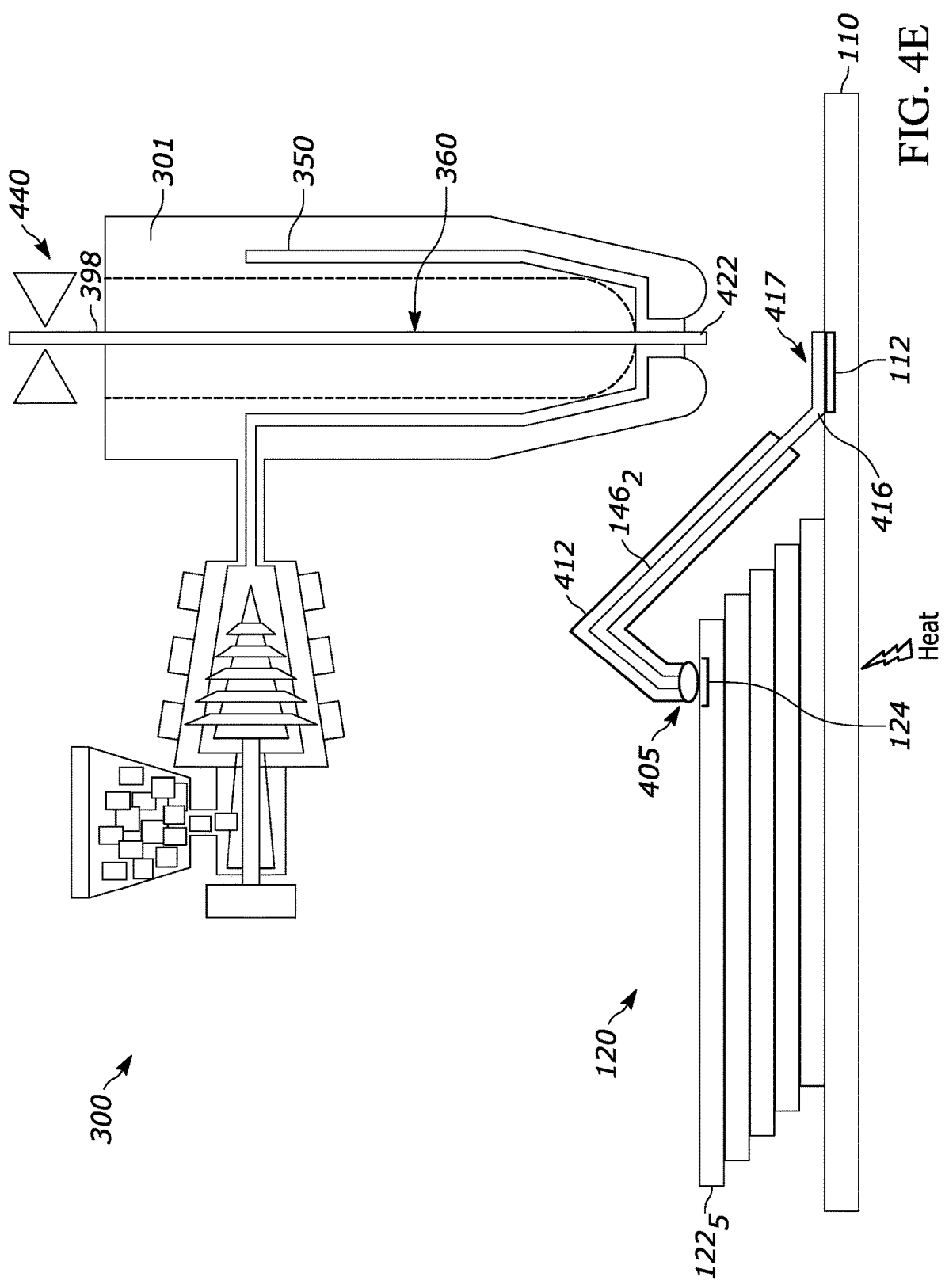

FIG. 4E illustrates operations of the block 206 directed at disconnecting a tail wire segment 422 of the metal wire 398 according to one example (also see FIG. 4D). More specifically, the tail wire segment 422 is disconnected from the second wire bond 417 to enable the capillary portion 301 to start formation of another bond wire $146_j$, e.g., at another contact pad 124. To perform the disconnect, a clamp 440 is closed to stop any movement of the metal wire 398 along the central channel 360 of the capillary portion 301. The capillary portion 301, together with the clamped metal wire 398, is then moved vertically up, farther away from the substrate 110. This vertical movement causes the tail wire segment 422 to break off the second wire bond 417, thereby freeing the capillary portion 301, as indicated in FIG. 4E, for further wire-bonding operations.

Figure 5A:
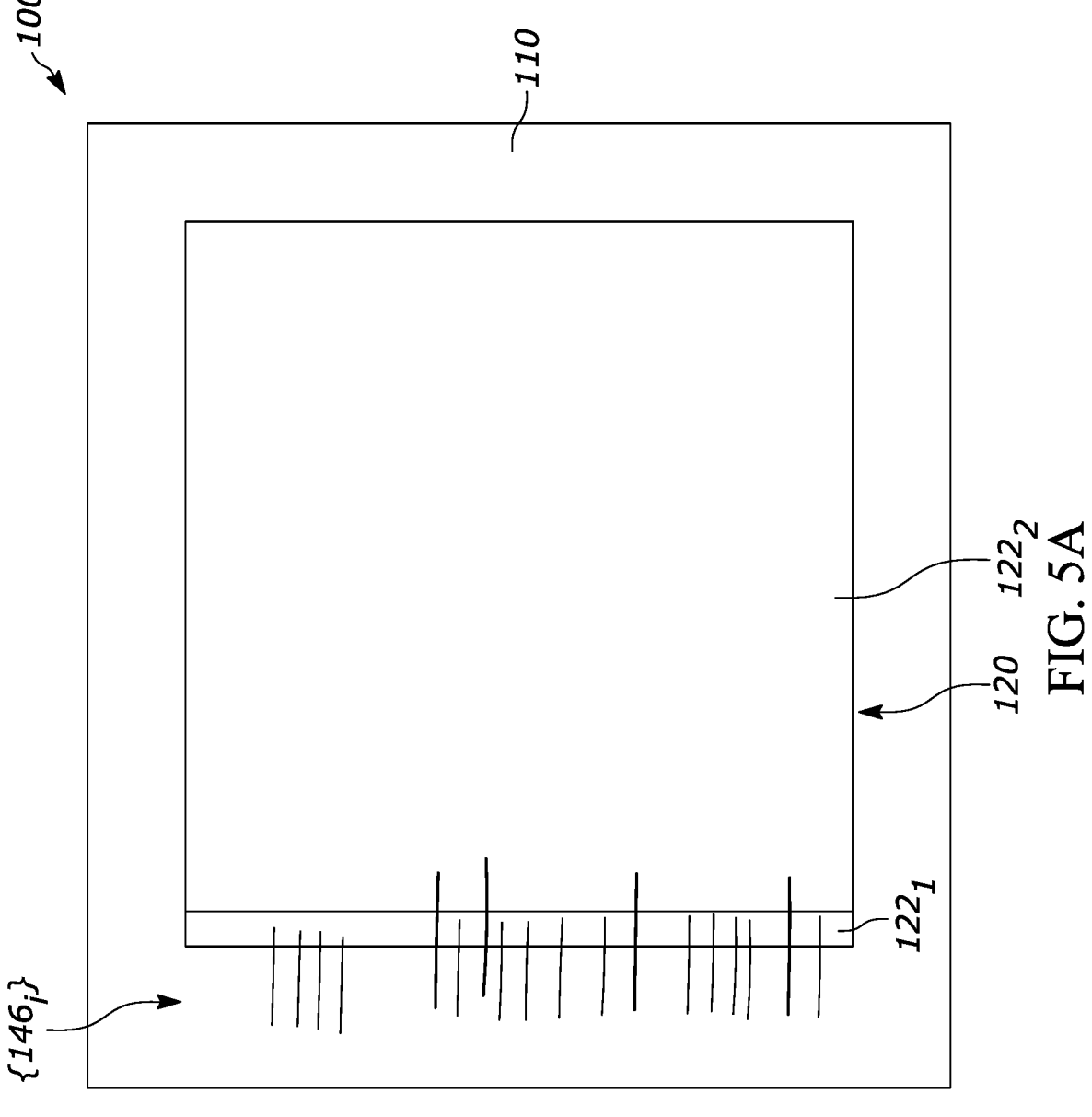
FIGS. 5A and 5B are schematic diagrams pictorially illustrating wire-shape changes caused by encapsulation operations of the manufacturing method of FIG. 2 according to some examples.
Figure 5B:
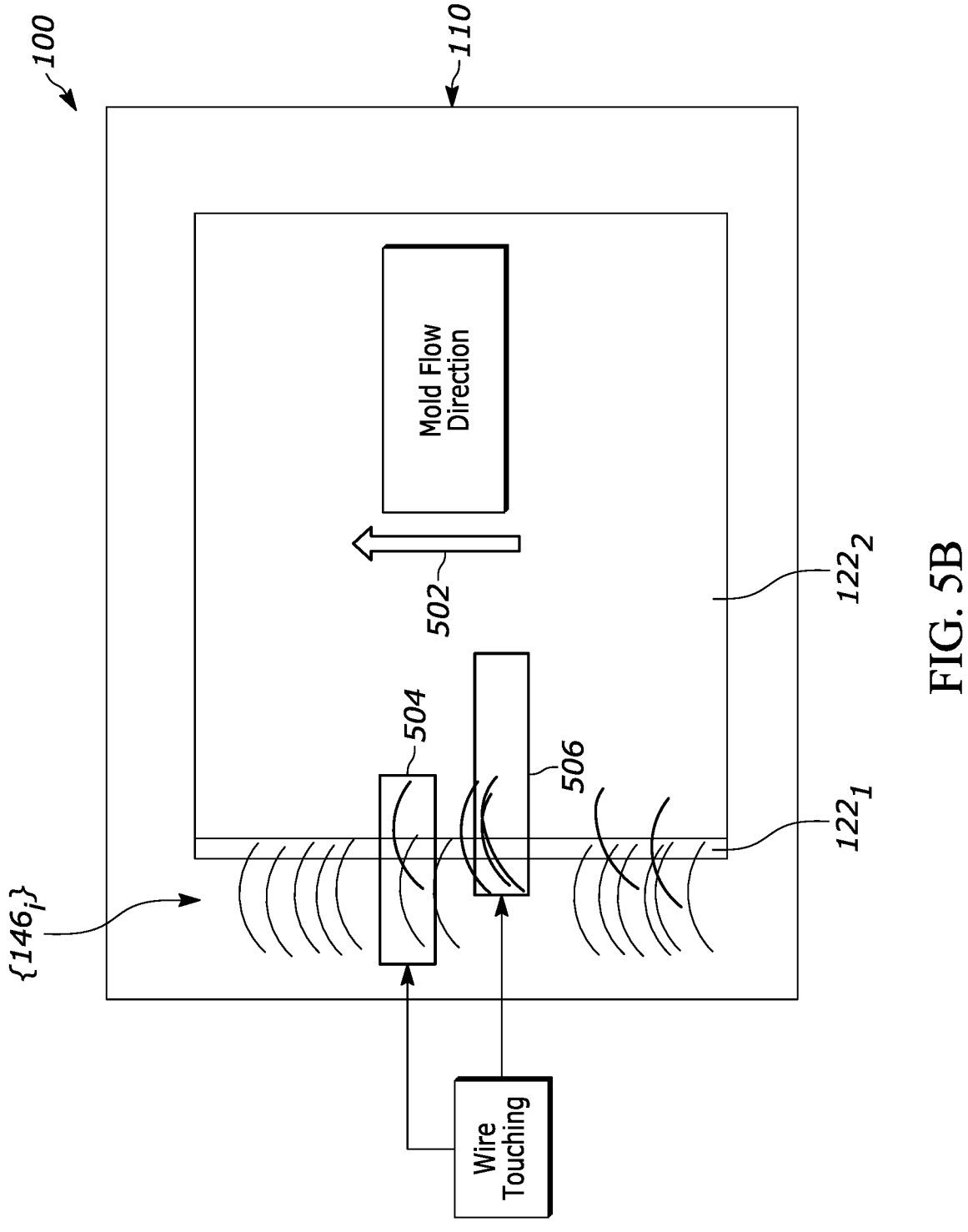

FIGS. 5A and 5B are schematic diagrams pictorially illustrating wire-shape changes caused by encapsulation operations of the block 208 of the method 200 according to some examples. More specifically, FIG. 5A shows a top view of the nascent semiconductor device 100 prior to the injection of the fluid molding compound 150 into the corresponding mold form. FIG. 5B shows a top view of the nascent semiconductor device 100 after the injection of the fluid molding compound 150 into the mold form.

For illustration purposes and without any implied limitations, FIGS. 5A and 5B show a simplified embodiment of the semiconductor device 100, wherein the die stack 120 has only two semiconductor dies $122_k$, which are labeled $122_1$ and $122_2$. The semiconductor die $122_2$ is the top die in the die stack 120, and the semiconductor die $122_1$ is the bottom die in the die stack 120. A plurality $\{146_i\}$ of metal wires is attached between the substrate 110 and the semiconductor dies $122_1$, $122_2$, e.g., as described above in reference to FIGS. 4A-4E. A first subset of the metal wires $146_i$ is attached between the substrate 110 and the semiconductor die $122_1$. A second subset of the metal wires $146_i$ is attached between the substrate 110 and the semiconductor die $122_2$.

As shown in FIG. 5A, prior to the injection of the fluid molding compound 150 into the mold form, each of the metal wires $146_i$ has a substantially planar shape. That is, each of the metal wires $146_i$ has a shape that is confined to a respective plane approximately orthogonal to a main surface of the substrate 110. Due to such planar shapes, each of the metal wires $146_i$ appears as a straight line in the top view of the semiconductor device 100 shown in FIG. 5A.

In FIG. 5B, the direction of the flow of the fluid molding compound 150 is indicated by a block arrow 502. When the speed and/or uncompensated pressure of the mold flow 502 is/are relatively high, some or all of the metal wires $146_i$ are swept and deformed in the direction of the mold flow 502 to adapt respective nonplanar shapes. That is, at least some of the deformed shapes are generally three-dimensional (3D) shapes that are no longer confined to the respective planes orthogonal to the main surface of the substrate 110. Due to such nonplanar 3D shapes, some or all of the deformed metal wires $146_i$ appear as curved lines in the top view of the semiconductor device 100 shown in FIG. 5B. For some of the metal wires $146_i$, the extent of deformations is such that two closely positioned metal wires are now in direct physical contact with one another. Boxes 504 and 506 indicate two representative examples of such wire touching. The box 504 marks an example in which a first metal wire attached between the substrate 110 and the semiconductor die $122_1$ and a second metal wire attached between the substrate 110 and the semiconductor die $122_2$ are in direct physical contact with one another. The box 506 marks another example in which first and second metal wires, both attached between the substrate 110 and the semiconductor die $122_2$, are in direct physical contact with one another.

According to an example embodiment, at least one of the first and second metal wires marked by the box 504 has a respective polymer coat 412 produced as described above in reference to FIGS. 4A-4E. Due to the presence of the polymer coat 412, the physical contact between those first and second metal wires does not create an electrical short in the semiconductor device 100. More specifically, the electrical insulation provided by the one or two polymer coats 412 in the area of interwire physical contact beneficially prevents the electrical short from being formed during the encapsulation operations of the block 208 of the method 200. Similarly, at least one of the first and second metal wires marked by the box 506 has a respective polymer coat 412 produced as described above in reference to FIGS. 4A-4E. The electrical insulation provided by the one or two polymer coats 412 in the area of interwire physical contact beneficially prevents the electrical short from being formed during the encapsulation operations of the block 208 of the method 200.

In various examples, depending on the particular embodiment of the semiconductor device 100, an electronic controller of the tool 300 is programmed to select individual ones of the bond wires $146_i$ for being coated with a respective polymer coat 412 based on one or more of the following selection criteria:

(i) An individual gold wire $146_i$ is selected for being coated with the respective polymer coat 412 when the wire length and diameter and the direction of the bonding are in accordance with the table shown in FIG. 6. Therein, the term "forward bonding" refers to the bonding order in which the wire is first bonded to the corresponding contact pad 124 and then is bonded to the corresponding contact pad 112. The term "reverse bonding" refers to the bonding order in which the wire is first bonded to the corresponding contact pad 112 and then is bonded to the corresponding contact pad 124.

(ii) An individual metal wire $146_i$ is selected for being coated with the respective polymer coat 412 when the orientation angle of the prior-to-encapsulation wire plane with respect to the mold flow direction (e.g., the direction 502, FIG. 5B) is between 60 degrees and 120 degrees.

(iii) An individual metal wire $146_i$ is selected for being coated with the respective polymer coat 412 when the prior-to-encapsulation arch height (e.g., see $H_1$ or $H_2$, FIG. 1) is larger than a first threshold value.

(iv) An individual metal wire $146_i$ is selected for being coated with the respective polymer coat 412 when the distance between the contact pad 124 of that wire and the contact pad 124 of the adjacent wire is smaller than a second threshold value.

(v) An individual metal wire $146_i$ is selected for being coated with the respective polymer coat 412 when the distance between the contact pad 112 of that wire and the contact pad 112 of the adjacent wire is smaller than a third threshold value.

(vi) An individual metal wire $146_i$ is selected for being coated with the respective polymer coat 412 when quality control assessments indicate a tendency of that wire to have a deformation magnitude greater than a fourth threshold value. An example of the deformation magnitude is a ratio of the maximum deviation distance of the wire from the plane of the initial planar shape to the length of the wire. An example of the fourth threshold value is 10%.

(vii) An individual metal wire $146_i$ is selected for being coated with the respective polymer coat 412 when a bond-wire pitch in a corresponding part of the semiconductor device 100 is smaller than a fifth threshold value.

Various selection criteria may typically be specific to the embodiment of the semiconductor device 100. The selection criteria may also depend on the specific parameters of the mold flow and/or the mold form used in the block 208 of the method 200. Individual metal wires 146ᵢ that are not selected for being coated may remain bare.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

Unless explicitly stated otherwise, each numerical value and range should be interpreted as being approximate as if the word "about" or "approximately" preceded the value or range.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third." etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Unless otherwise specified herein, in addition to its plain meaning, the conjunction "if" may also or alternatively be construed to mean "when" or "upon" or "in response to determining" or "in response to detecting." which construal may depend on the corresponding specific context. For example, the phrase "if it is determined" or "if [a stated condition] is detected" may be construed to mean "upon determining" or "in response to determining" or "upon detecting [the stated condition or event]" or "in response to detecting [the stated condition or event]."

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three-dimensional structure as shown in the figures. Such "height" would be vertical where the dies are horizontal but would be horizontal where the dies are vertical, and so on. Similarly, while the figures show the dies as horizontal layers, such orientation is for descriptive purpose only and not to be construed as a limitation.

Also for purposes of this description, the terms "couple," "coupling." "coupled." "connect," "connecting." or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. The same type of distinction applies to the use of terms "attached" and "directly attached," as applied to a description of a physical structure. For example, a relatively thin layer of adhesive or other suitable binder can be used to implement such "direct attachment" of the two corresponding components in such physical structure.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

"SUMMARY" in this specification is intended to introduce some example embodiments, with additional embodiments being described in "DETAILED DESCRIPTION" and/or in reference to one or more drawings. "SUMMARY" is not intended to identify essential elements or features of the claimed subject matter, nor is it intended to limit the scope of the claimed subject matter.

"ABSTRACT" is provided to allow the reader to quickly ascertain the nature of the technical disclosure. It is submitted with the understanding that it will not be used to interpret or limit the scope or meaning of the claims. In addition, in the foregoing "DETAILED DESCRIPTION," it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into "DETAILED DESCRIPTION," with each claim standing on its own as a separately claimed subject matter.

What is claimed is:

1. A method for assembling a semiconductor device, the method comprising:

bonding segments of a bond wire between a vertical stack of semiconductor dies and a first main surface of a substrate, the segments of the bond wire providing electrical connections between the semiconductor dies and the substrate, the vertical stack being supported on the first main surface of the substrate and having the semiconductor dies thereof horizontally offset with respect to one another;

coating, with a wire bonding tool during the bonding, a selected subset of the segments of the bond wire with an electrically insulating polymer; and encapsulating, with a molding compound, the vertical stack of semiconductor dies, the bonded segments of the bond wire attached between the vertical stack of semiconductor dies and the first main surface of the substrate, and at least a portion of the first main surface of the substrate.

2. The method of claim 1, further comprising selecting said selected subset of the segments of the bond wire based on one or more selection criteria from the group consisting of:

a set of criteria specifying a relationship between a segment length, a wire diameter, and a direction of the bonding;

an orientation angle of a corresponding bond wire in the semiconductor device with respect to a flow direction of the molding compound during the encapsulating;

a loop height of the corresponding bond wire in the semiconductor device with respect to the first main surface of the substrate; and a bond-wire pitch in a corresponding part of the semiconductor device.

3. The method of claim 1, further comprising attaching a plurality of solder balls to the second main surface of the substrate.

4. A semiconductor device, comprising:

a substrate having a first main surface and an opposing second main surface;

one or more semiconductor dies attached to the first main surface;

a plurality of bond wires electrically connecting at least one of the one or more semiconductor dies to the first main surface of the substrate, wherein a first bond wire of the plurality of bond wires includes a polymer-coated segment, and wherein a second bond wire of the plurality of bond wire is uncoated with a polymer; and a molding compound encapsulating the one or more semiconductor dies, the plurality of bond wires, and at least a portion of the first main surface of the substrate.

5. The semiconductor device of claim 4, further comprising a plurality of solder balls attached to the second main surface of the substrate.

6. The semiconductor device of claim 4, wherein the first bond wire and the second bond wire are in physical contact with one another; and wherein the polymer-coated segment is in an area of the physical contact.

7. The semiconductor device of claim 6, wherein the first bond wire has a first loop height; and wherein the second bond wire has a second loop height different from the first loop height.

8. The semiconductor device of claim 6, wherein the first bond wire is connected between a first contact pad located on a first one of the semiconductor dies and a second contact pad located on the first main surface of the substrate; and wherein the second bond wire is connected between a third contact pad located on one of the semiconductor dies and a fourth contact pad located on the first main surface of the substrate.

9. The semiconductor device of claim 6, wherein the first bond wire is connected between a first contact pad located on a first semiconductor die of the one or more semiconductor dies and a second contact pad located on the first main surface of the substrate; and wherein the second bond wire is connected between a third contact pad located on the first semiconductor die and a fourth contact pad located on the first main surface of the substrate.

10. The semiconductor device of claim 6, wherein the first bond wire and the second bond wire have different respective loop shapes.

11. The semiconductor device of claim 6, wherein the first bond wire and the second bond wire have different respective lengths.

12. The semiconductor device of claim 6, wherein the plurality of bond wires includes a third bond wire and a fourth bond wire in another physical contact with one another; and wherein at least one of the third bond wire and the fourth bond wire has another polymer coat in an area of said another physical contact.

13. The semiconductor device of claim 4, wherein a polymer coat of the polymer-coated segment comprises a thermosetting polymer.

14. The semiconductor device of claim 4, wherein a polymer coat of the polymer-coated segment comprises a polyimide.

15. The semiconductor device of claim 4, wherein a polymer coat of the polymer-coated segment comprises a first dielectric material; and wherein the molding compound comprises a different second dielectric material.

16. The semiconductor device of claim 4, wherein the semiconductor dies are arranged in a vertical stack attached to the first main surface and are horizontally offset with respect to one another.

* * * * *